(12) United States Patent
Aida et al.

(10) Patent No.: US 7,495,299 B2
(45) Date of Patent: Feb. 24, 2009

(54) SEMICONDUCTOR DEVICE

(75) Inventors: Kazuhiko Aida, Chiba (JP); Junji Hirase, Osaka (JP); Hisashi Ogawa, Osaka (JP); Chiaki Kudo, Hyogo (JP)

(73) Assignee: Panasonic Corporation, Osaka (JP)

( * ) Notice: Subject to any disclaimer, the term of this patent is extended or adjusted under 35 U.S.C. 154(b) by 114 days.

(21) Appl. No.: 11/544,611

(22) Filed: Oct. 10, 2006

(65) Prior Publication Data
US 2007/0131930 A1 Jun. 14, 2007

(30) Foreign Application Priority Data
Dec. 13, 2005 (JP) ............... 2005-359426

(51) Int. Cl.
*H01L 29/78* (2006.01)
(52) U.S. Cl. ............... 257/412; 257/388; 257/E29.161; 438/655
(58) Field of Classification Search ........... 257/296, 257/412, 413, 388
See application file for complete search history.

(56) References Cited

U.S. PATENT DOCUMENTS 7,427,796 B2 * 9/2008 Hokazono ............ 257/412
2005/0148189 A1 * 7/2005 Sung .................... 438/698
2005/0272235 A1 * 12/2005 Wu et al. ............. 438/592
2007/0138557 A1 * 6/2007 Ipposhi ................ 257/347
2008/0224223 A1 * 9/2008 Hirase .................. 257/365

FOREIGN PATENT DOCUMENTS

JP 2000-112114 4/2000

* cited by examiner

*Primary Examiner*—Jerome Jackson, Jr.
*Assistant Examiner*—Paul A Budd
(74) *Attorney, Agent, or Firm*—McDermott Will & Emery LLP

(57) ABSTRACT

The following steps are carried out: forming a gate electrode on a semiconductor substrate with a gate insulating film interposed therebetween, forming a dummy gate electrode on the semiconductor substrate with a dummy gate insulating film interposed therebetween and forming another dummy gate electrode on the semiconductor substrate with an insulating film for isolation interposed therebetween; forming a metal film on the semiconductor while exposing the gate electrode and covering the dummy gate electrodes; and subjecting the semiconductor substrate to heat treatment and thus siliciding at least an upper part of the gate electrode. Since the gate electrode is silicided and the dummy gate electrodes are non-silicided, this restrains a short circuit from being caused between the gate electrode and adjacent one of the dummy gate electrodes.

11 Claims, 6 Drawing Sheets

▭ : Designed gate pattern

▨ : Dummy gate pattern

╲╲╲ : Phase shift region

SEMICONDUCTOR DEVICE

BACKGROUND OF THE INVENTION (1) Field of the Invention

The present invention relates to semiconductor devices including gate electrodes and dummy gate electrodes and methods for fabricating the same.

(2) Description of Related Art

In recent years, with an increasing degree of integration of semiconductor integrated circuits and an increasing operating speed thereof, increasing significance has been attached to control over the dimensions of gate electrodes of MIS transistors which significantly influence the characteristics of semiconductor integrated circuits. Meanwhile, a part of a semiconductor integrated circuit in which MIS transistors densely exist and a part thereof in which MIS transistors sparsely exist are both necessarily mixed in the semiconductor integrated circuit. Such variations in the density of MIS transistors formed in a semiconductor integrated circuit have an influence on processes for processing gate electrodes of MIS transistors, such as a photolithography process and an etching process, leading to an increase in differences in dimension among processed gate electrodes. After formation of MIS transistors, an interlayer dielectric deposited on the MIS transistors is planarized by chemical mechanical polishing (CMP). The thickness of the planarized interlayer dielectric significantly depends on the density of transistors located under the interlayer dielectric.

In order to solve the above-described problem, the following method has been suggested: For example, dummy gate electrodes that are unnecessary for actual circuit operation are uniformly formed in a semiconductor device, thereby suppressing the above-described process variations.

FIGS. 6A and 6B are diagrams illustrating a known method for forming a gate electrode. The known method is disclosed in Japanese Unexamined Patent Publication No. 2000-112114. As illustrated in FIGS. 6A and 6B, dummy gate electrodes are formed in the vicinity of gate electrodes. In this way, all the gate electrodes including dummy gate electrodes can be arranged under the same surrounding conditions. This can suppress variations in dimension among gates.

In a case where an interlayer dielectric deposited to cover MIS transistors is to be planarized by CMP, dummy gate electrodes have been widely utilized to make the thickness of the planarized interlayer dielectric uniform, thereby reducing variations in the density of gate electrodes among locations.

On the other hand, in order to further increase the operating speed of semiconductor devices, metals or their alloys have been frequently used which achieve a reduction in the resistance of gate electrodes and contribute to the stability of transistor characteristics. These materials are metallurgically stable toward heat and chemical solutions and of low resistance and high reliability. This significantly contributes to increases in the degree of integration and operating speed of semiconductor integrated circuits. One of the techniques using such a metal is a silicidation technique. In recent years, this silicidation technique has been widely utilized for fabrication of semiconductor devices.

SUMMARY OF THE INVENTION

In a semiconductor device including dummy gate electrodes as described above and utilizing a silicidation technique, a gate electrode necessary for circuit operation may be formed adjacent to a dummy gate electrode that is unnecessary for circuit operation. The respective upper parts of the gate electrode and the dummy gate electrode are both silicided. Since this silicidation increases the volume of polysilicon used as a material of the gate electrode, the respective upper parts of the gate electrode and the dummy gate electrode are expanded. Therefore, it is likely to cause a short circuit between the gate electrode and the dummy gate electrode. When the gate electrode is electrically connected to the dummy gate electrode, this is very likely to cause a problem in the operation of the semiconductor device due to the low resistance of silicide at which the gate electrode is connected to the dummy gate electrode and other reasons. In addition, the dimensions of gate electrodes and the distance between adjacent ones of gate electrodes are reduced with each passing year, and it is difficult to control the amount of silicide formed by siliciding a minute gate electrode. This increases the possibility of causing a short circuit between a gate electrode and a dummy gate electrode.

In view of the above, an object of the present invention is to provide a semiconductor device that restrains a short circuit from being caused between a gate electrode and a dummy gate electrode and a fabrication method for the same.

A semiconductor device according to a first aspect of the present invention includes: a semiconductor substrate; a MIS transistor including a gate insulating film formed on the semiconductor substrate and a gate electrode formed on the gate insulating film, at least an upper part of said gate electrode being silicided; a dummy transistor including a dummy gate electrode formed above the semiconductor substrate and made of non-silicided silicon.

With this structure, since the dummy gate electrode is not silicided, this can prevent an upper part of the dummy gate electrode from being connected with silicided part of the gate electrode. In other words, a short circuit can be prevented from being caused between the gate electrode and the adjacent dummy gate electrode. This allows semiconductor devices to be fabricated with high yield and enhances the reliability of the semiconductor devices.

In the semiconductor device of the first aspect of the present invention, the gate electrode may be fully silicided. In this case, the gate electrode is prevented from being depleted during operation, thereby enhancing the performance of the semiconductor device. Furthermore, when the gate electrode is fully silicided, the volume of the gate electrode significantly increases as compared with that of the gate electrode before silicidation. However, since the dummy gate electrode is not silicided, this restrains a short circuit from being caused between the gate electrode and the dummy gate electrode.

The silicided gate electrode is preferably made of metal silicide formed by causing a reaction between silicon and a refractory metal, such as nickel (Ni) silicide or cobalt (Co) silicide.

A semiconductor device according to a second aspect of the present invention includes: a semiconductor substrate; a MIS transistor including a gate insulating film formed on the semiconductor substrate, a gate electrode formed on the gate insulating film, at least an upper part of said gate electrode being silicided, and a first sidewall formed on a side of the gate electrode; and a second sidewall formed on the semiconductor substrate, made of the same material as the first sidewall and forming a recess.

With this structure, since the dummy gate electrode itself is removed, a short circuit does not occur between the gate electrode and the dummy gate electrode even when the gate electrode is silicided.

A method for fabricating a semiconductor device according to a third aspect of the present invention includes the steps of: (a) forming a gate electrode of silicon on a semiconductor substrate with a gate insulating film interposed therebetween and forming a dummy gate electrode of silicon on the semiconductor substrate with a dummy gate insulating film or an insulating film for isolation interposed therebetween; (b) forming a metal film on at least the gate electrode; and (c) subjecting the semiconductor substrate to heat treatment to cause a reaction between the gate electrode and the metal film and thus siliciding at least an upper part of the gate electrode, wherein in the step (c), the dummy gate electrode is non-silicided.

According to this method, since in the step (c) the dummy gate electrode is not silicided, this can prevent the dummy gate electrode from expanding and thus becoming shorted to the gate electrode.

The method according to the third aspect of the present invention may further include the step of (d) after the step (a) and before the step (b), forming a mask to cover at least the dummy gate electrode. In the step (b), the metal film may be formed on the semiconductor substrate to cover the exposed gate electrode while the dummy gate electrode is covered with the mask. According to this method, when the metal film is formed on the semiconductor substrate to silicide the gate electrode, the dummy gate electrode is not exposed. This can certainly prevent the dummy gate electrode from being silicided. In other words, a short circuit can be prevented from being caused between the gate electrode and the adjacent dummy gate electrode. In view of the above, the above-mentioned method allows semiconductor devices to be fabricated with high yield.

DETAILED DESCRIPTION OF THE INVENTION

Embodiment 1

A first embodiment of the present invention will be described with reference to the drawings.

FIGS. 1A through 1D are cross-sectional views illustrating a fabrication method for a semiconductor device according to the first embodiment of the present invention. "Dummy gate electrodes" herein represent gate electrodes of a semiconductor device that are not concerned with circuit operation. As previously described, dummy gate electrodes are formed to finish gate electrodes as designed or to make the top surface of an interlayer dielectric uniform in planarization of the interlayer dielectric. When dummy gate electrodes are formed to finish gate electrodes as designed, they each often have a gate length of 10 μm or less. When dummy gate electrodes are formed to make the thickness of an interlayer dielectric uniform, they each often have a gate length of 10 μm. In this embodiment, a description will be given of a fabrication method for a semiconductor device including a MIS transistor having a gate electrode whose upper part is silicided and dummy transistors each having a non-silicided dummy gate electrode that has a gate length of 10 μm or less.

Figure 1A:
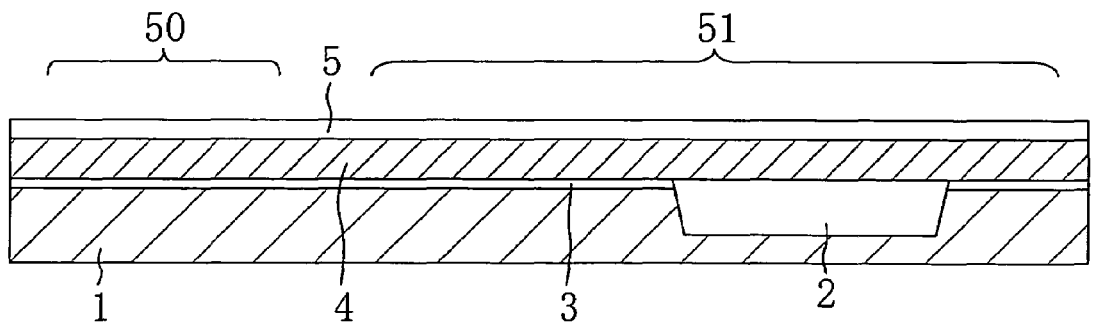
FIGS. 1A through 1D are cross-sectional views illustrating a fabrication method for a semiconductor device according to a first embodiment of the present invention.

First, as illustrated in FIG. 1A, an isolation region 2 (insulating film for isolation) is selectively formed in a semiconductor substrate 1 of, for example, silicon by shallow trench isolation (STI). As a result, active regions are formed in the semiconductor substrate 1 so as to be surrounded by the isolation region 2. Subsequently, a first insulating film 3 of silicon oxide is formed on the semiconductor substrate 1 by thermal oxidation to have a thickness of, for example, 2 nm. Subsequently, a polysilicon film 4 is formed on the first insulating film 3 by chemical vapor deposition (CVD) to have a thickness of, for example, 100 nm. Thereafter, a 20-nm-thick second insulating film 5 is formed on the top surface of the polysilicon film 4 by CVD using tetra ethyl ortho silicate (TEOS). Herein, reference numeral 50 denotes a region of the semiconductor substrate 1 on which an element is to be formed (hereinafter, referred to as "element formation region"), and reference numeral 51 denotes a region thereof on which a dummy element is to be formed (hereinafter, referred to as "dummy element formation region"). In the exemplary semiconductor device illustrated in FIGS. 1A through 1D, the dummy element formation region 51 includes part of each active region and at least part of the isolation region 2.

Figure 1B:
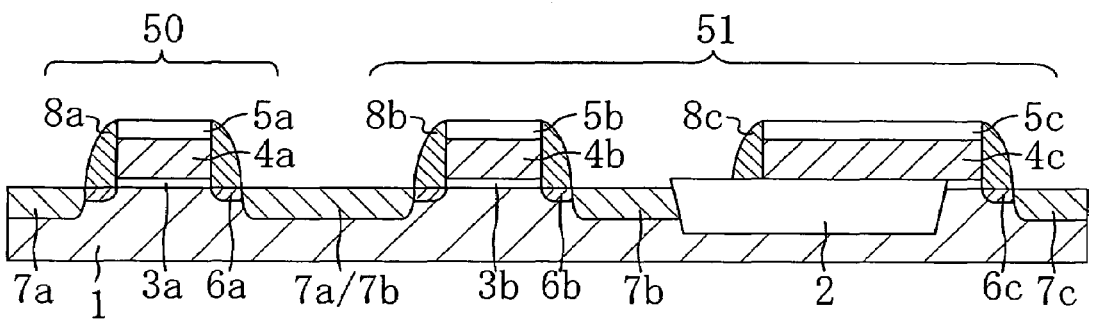

Next, as illustrated in FIG. 1B, the polysilicon film 4 and the first insulating film 3 are patterned by lithography and etching, thereby forming a pair of a gate insulating film 3a and a gate electrode 4a and a pair of a dummy gate insulating film 3b and a dummy gate electrode 4b on one of the active regions of the semiconductor substrate 1. Simultaneously, a dummy gate electrode 4c is formed on the isolation region 2. The gate electrode 4a, the dummy gate electrode 4b and the dummy gate electrode 4c have gate lengths of approximately 60 nm, 60 nm and 5 μm, respectively. In this process step, the second insulating film 5 is also partially removed. In this way, insulating films are formed on the gate electrode 4a and the dummy gate electrodes 4b and 4c, respectively. One of the insulating films formed on the gate electrode 4a is referred to as "on-gate insulating film 5a", another thereof formed on the dummy gate electrode 4b is referred to as "dummy on-gate insulating film 5b", and the other thereof formed on the dummy gate electrode 4c is referred to as "dummy on-gate insulating film 5c".

Subsequently, arsenic ions are implanted into the semiconductor substrate 1 by ion implantation, for example, at an acceleration energy of 3 keV and a dose of $1.3 \times 10^{15}$ $cm^{-2}$. In this way, n-type extension regions 6a are formed in regions of the semiconductor substrate 1 located to both sides of the gate electrode 4a, n-type extension regions 6b are formed in regions of the semiconductor substrate 1 located to both sides of the dummy gate electrode 4b, and n-type extension regions 6c are formed in regions of the semiconductor substrate 1 located to both sides of the dummy gate electrode 4c. Next, an approximately-13-nm-thick silicon oxide film is formed by CVD using TEOS to cover the semiconductor substrate 1, and then a 50-nm-thick silicon nitride film is formed on the silicon oxide film by CVD. Thereafter, the silicon oxide film and the silicon nitride film are subjected to an etch back process. In this way, approximately-45-nm-wide sidewalls 8a are formed on both sides of the gate electrode 4a, approximately-45-nm-wide sidewalls 8b are formed on both sides of the dummy gate electrode 4b, and approximately-45-nm-wide sidewalls 8c are formed on both sides of the dummy gate electrode 4c. Subsequently, arsenic ions are implanted into the active region of the semiconductor substrate 1 using a combination of the gate electrode 4a and the sidewalls 8a, a combination of the dummy gate electrode 4b and the sidewalls 8b and a combination of the dummy gate electrode 4c and the dummy gate electrode 8c as masks, thereby forming n-type impurity diffusion layers 7a, 7b and 7c. In this case, the acceleration energy of the arsenic ions is, for example, 20 keV, and the dose thereof is $4.0 \times 10^{15}$ cm$^{-2}$. In the exemplary semiconductor device illustrated in FIG. 1B, one of the impurity diffusion layers 7a formed to both sides of the gate electrode 4a adjacent to the dummy gate electrode 4b is identical with one of the impurity diffusion layers 7b formed to both sides of the dummy gate electrode 4b. The impurity diffusion layers 7a serve as source/drain regions.

Figure 1C:
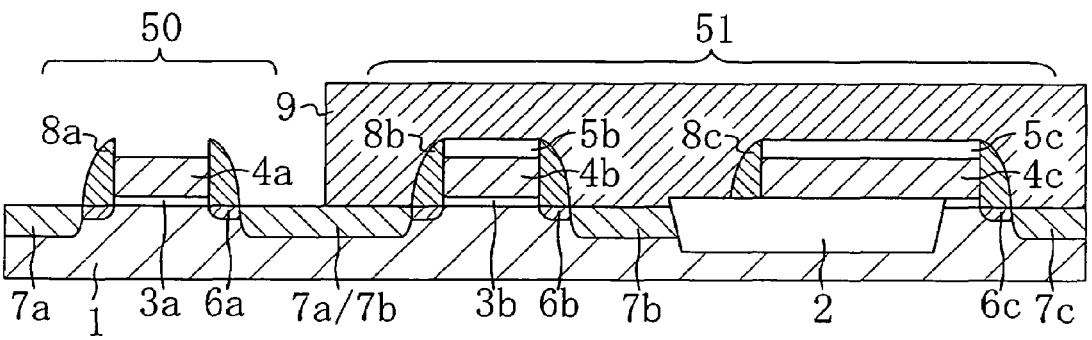

Next, as illustrated in FIG. 1C, a resist is applied to entirely cover the semiconductor substrate 1, and then a resist mask 9 is formed by lithography to expose the element formation region 50 and cover the dummy element formation region 51. Subsequently, the on-gate insulating film 5a formed on the top surface of the gate electrode 4a is removed by dry etching using the resist mask 9.

Figure 1D:
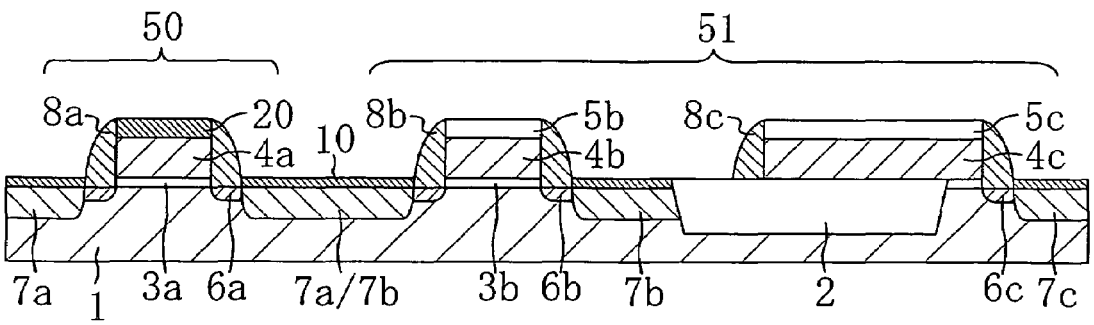

Next, as illustrated in FIG. 1D, the resist mask 9 is removed, and then an approximately 5- through 40-nm-thick metal film of a refractory metal, such as cobalt (Co) or nickel (Ni), is formed by sputtering or any other method to entirely cover the semiconductor substrate 1. Next, the semiconductor substrate 1 is subjected to heat treatment, for example, at a temperature of approximately 320° C. Thereafter, unreacted part of the metal film that is not silicided is removed. In this manner, a gate silicide film 20 is formed on the gate electrode 4a formed on the element formation region 50 of the semiconductor substrate 1. Furthermore, silicide films 10 are formed on the impurity diffusion layers 7a, 7b and 7c. A semiconductor device including a MIS transistor having a gate electrode 4a and a gate silicide film 20, a first dummy transistor having a dummy gate electrode 4b, and a second dummy transistor having a dummy gate electrode 4c is fabricated through the above-mentioned process steps.

According to the fabrication method for a semiconductor device of this embodiment, an upper part of the gate electrode 4a can be silicided without siliciding the dummy gate electrodes 4b and 4c. In a miniaturized semiconductor device including a semiconductor integrated circuit having a MIS transistor, even when a dummy gate electrode is formed adjacent to a gate electrode formed with a silicide film, a short circuit can be prevented from being caused between the gate electrode and the dummy gate electrode. The method of this embodiment can reduce the contact resistance of the gate electrode and the impurity diffusion layers and allows a high-reliability semiconductor device to be fabricated.

As illustrated in FIG. 1D, a semiconductor device of this embodiment fabricated by the above-mentioned method includes a semiconductor substrate 1 in which active regions and an isolation region 2 surrounding each active region are formed, a MIS transistor and a first dummy transistor both formed on the active region of the semiconductor substrate 1, and a second dummy transistor formed on the isolation region 2 of the semiconductor substrate 1.

The MIS transistor includes a gate insulating film 3a formed on the semiconductor substrate 1, a gate electrode 4a formed on the gate insulating film 3a, a gate silicide film 20 formed on the gate electrode 4a and made of metal silicide, such as Co silicide or Ni silicide, sidewalls 8a formed on both sides of the gate electrode 4a, impurity diffusion layers 7a formed in regions of the semiconductor substrate 1 located to both sides of the sidewalls 8a, and silicide films 10 formed on the impurity diffusion layers 7a.

The first dummy transistor includes a dummy gate insulating film 3b formed on the semiconductor substrate 1, a dummy gate electrode 4b formed on the dummy gate insulating film 3b, a dummy on-gate insulating film 5b formed on the dummy gate electrode 4b, sidewalls 8b formed on both sides of the dummy gate electrode 4b, impurity diffusion layers 7b formed in regions of the semiconductor substrate 1 located to both sides of the sidewalls 8b, and silicide films 10 formed on the impurity diffusion layers 7b. Unlike the first dummy transistor, a dummy gate electrode 4c of the second dummy transistor is formed on the isolation region 2. On the other hand, like the first dummy transistor, no silicide film is formed on the top surface of the dummy gate electrode 4c. Under normal conditions, electrical signals are not fed to the dummy gate electrodes 4b and 4c, and thus the first and second dummy transistors do not operate.

Although in this embodiment the semiconductor device includes dummy gate electrodes for finishing gate electrodes as designed, the same method can be applied for fabrication of a semiconductor device including dummy gate electrodes each having a gate length of 10 μm or more and configured to make the thickness of an interlayer dielectric uniform.

In the fabrication method for a semiconductor device of this embodiment, these impurity diffusion layers 7a, 7b and 7c may be silicided after the formation of the impurity diffusion layers 7a, 7b and 7c in the process step illustrated in FIG. 1B. In this case, the gate silicide film 20 can have a different thickness from each silicide film 10.

The gate electrode 4a and the dummy gate electrodes 4b and 4c formed in the process step illustrated in FIG. 1B need only be made of silicon and may be made of amorphous silicon instead of polysilicon.

In this embodiment and subsequent embodiments, values represented as the thicknesses, widths and the like of components are exemplary values, and the values may be appropriately changed within the scope of the present invention.

Embodiment 2

FIGS. 2A through 2E are cross-sectional views illustrating a fabrication method for a semiconductor device according to a second embodiment of the present invention. In these figures, the same components as those of the semiconductor device of the first embodiment are denoted by the same reference numerals, and thus a description of the same components will be simplified.

Figure 2A:
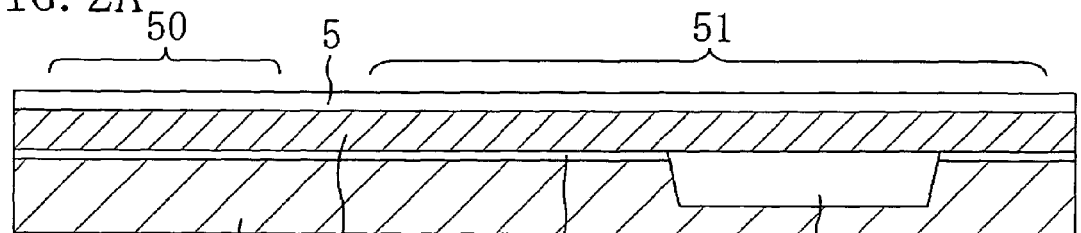
FIGS. 2A through 2E are cross-sectional views illustrating a fabrication method for a semiconductor device according to a second embodiment of the present invention.

First, in the process step illustrated in FIG. 2A, like the process step illustrated in FIG. 1A of the first embodiment, an isolation region 2 is selectively formed in a semiconductor substrate 1. As a result, active regions are formed in the semiconductor substrate 1 so as to be surrounded by the isolation region 2. Subsequently, a 2-nm-thick first insulating film 3 and a 100-nm-thick polysilicon film 4 are deposited on the semiconductor substrate 1. Thereafter, a 20-nm-thick second insulating film 5 is deposited on the top surface of the polysilicon film 4.

Figure 2B:
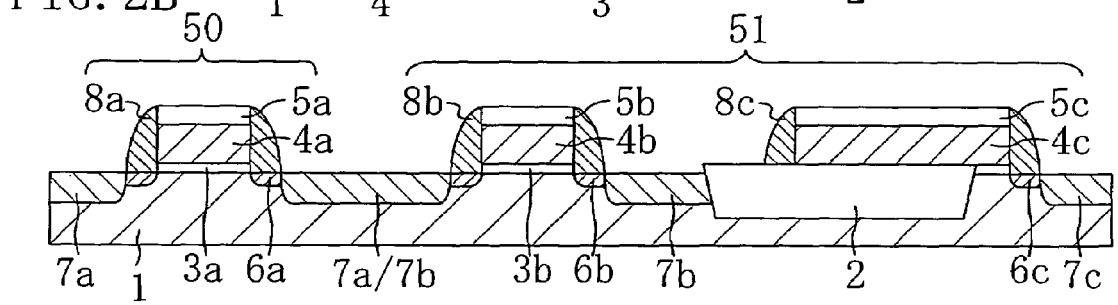

Next, in the process step illustrated in FIG. 2B, like the process step illustrated in FIG. 1B, a pair of a gate insulating film 3a and a gate electrode 4a and a pair of a dummy gate insulating film 3b and a dummy gate electrode 4b are formed on one of the active regions of the semiconductor substrate 1. Simultaneously, a dummy gate electrode 4c is formed on the isolation region 2. The gate electrode 4a, the dummy gate electrode 4b and the dummy gate electrode 4c have gate lengths of approximately 60 nm, 60 nm and 5 μm, respectively. In this process step, the second insulating film 5 is also partially removed. In this way, an on-gate insulating film 5a is formed on the gate electrode 4a, and dummy on-gate insulating films 5b and 5c are formed on the dummy gate electrodes 4b and 4c, respectively.

Subsequently, arsenic ions are implanted into the semiconductor substrate 1 by ion implantation, thereby forming extension regions 6a, 6b and 6c. Next, an approximately-13-nm-thick silicon oxide film is formed by CVD using TEOS to entirely cover the semiconductor substrate 1, and then a 50-nm-thick silicon nitride film is formed on the silicon oxide film by CVD. Thereafter, the silicon oxide film and the silicon nitride film are subjected to an etch back process. In this way, approximately-45-nm-wide sidewalls 8a are formed on both sides of the gate electrode 4a, approximately-45-nm-wide sidewalls 8b are formed on both sides of the dummy gate electrode 4b, and approximately-45-nm-wide sidewalls 8c are formed on both sides of the dummy gate electrode 4c. Subsequently, arsenic ions are implanted into the active regions of the semiconductor substrate 1 using a combination of the gate electrode 4a and the sidewalls 8a, a combination of the dummy gate electrode 4b and the sidewalls 8b and a combination of the dummy gate electrode 4c and the dummy gate electrode 8c as masks, thereby forming n-type impurity diffusion layers 7a, 7b and 7c. The above-mentioned process steps are the same as those in the method of the first embodiment.

Figure 2C:
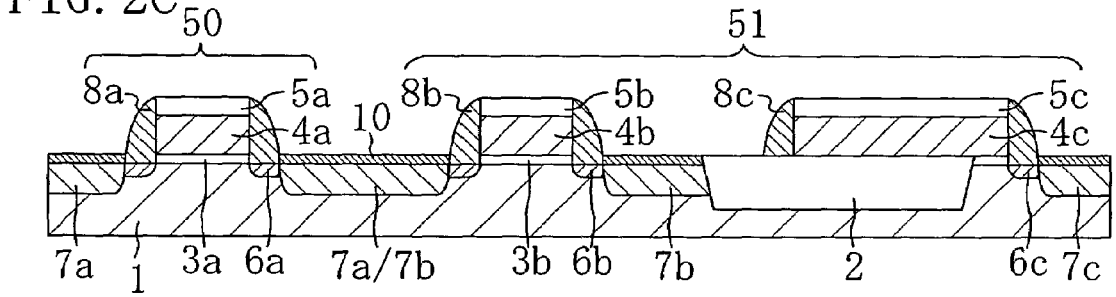

Next, in the process step illustrated in FIG. 2C, an approximately 20- through 40-nm-thick metal film of a refractory metal, such as cobalt (Co) or nickel (Ni), is formed by sputtering or any other method to entirely cover the semiconductor substrate 1. Then, the semiconductor substrate 1 is subjected to heat treatment, for example, at a temperature of approximately 320° C. Thereafter, unreacted part of the metal film that is not silicided is removed. In this way, silicide films 10 are formed on the impurity diffusion layers 7a, 7b and 7c formed in the semiconductor substrate 1.

Figure 2D:
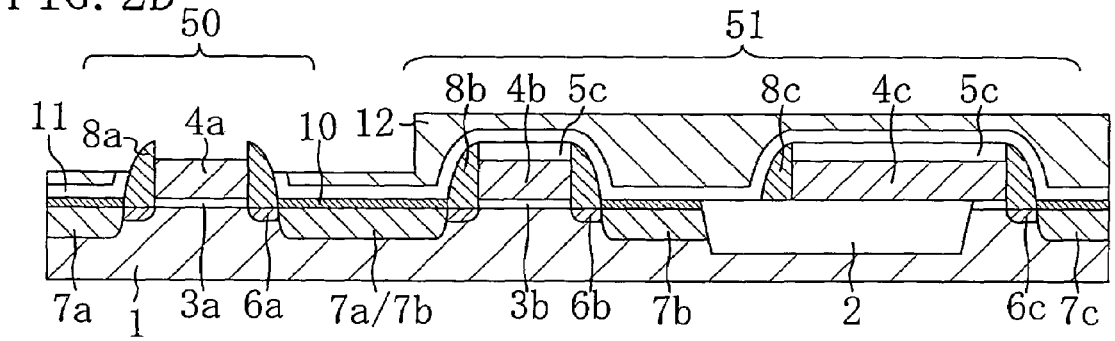

Next, as illustrated in FIG. 2D, an approximately-20-nm-thick silicon nitride film 11 is formed by atomic layer deposition (ALD) to entirely cover the semiconductor substrate 1. Subsequently, an approximately-400-nm-thick silicon oxide film 12 is formed on the silicon nitride film 11 by CVD or any other method. Thereafter, the silicon oxide film 12 is polished by CMP to have a thickness of approximately 200 nm. Next, a resist is entirely applied to the semiconductor substrate 1, and then a resist mask (not shown) is formed by lithography to expose an element formation region 50 and cover a dummy element formation region 51. Subsequently, respective parts of the silicon nitride film 11 and the silicon oxide film 12 formed on the element formation region 50 are partially removed by reactive ion etching (RIE) using the resist mask. In this case, the silicon oxide film 12 and the silicon nitride film 11 are subjected to etching until the top surface of the on-gate insulating film 5a is exposed. Thereafter, the on-gate insulating film 5a formed on the top surface of the gate electrode 4a is also removed.

Figure 2E:
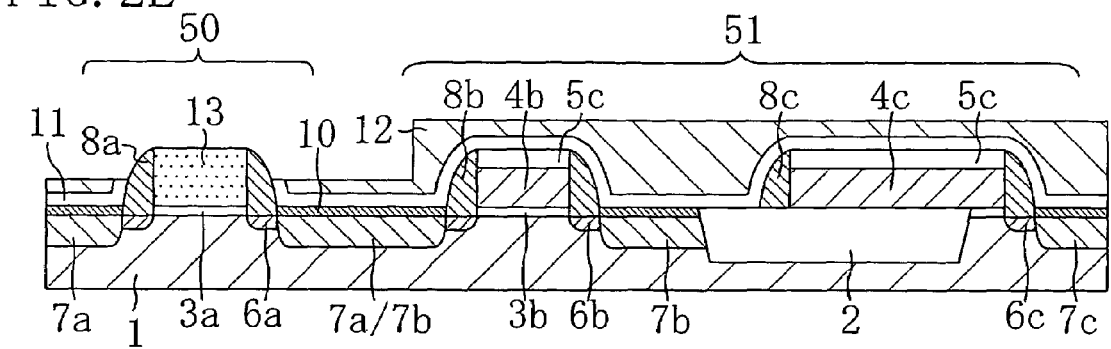

Next, as illustrated in FIG. 2E, an approximately-100-nm-thick metal film of a refractory metal, such as Co or Ni, is formed to entirely cover the semiconductor substrate 1. Next, the semiconductor substrate 1 is subjected to heat treatment, for example, at a temperature of approximately 320° C. Thereafter, unreacted part of the metal film that is not silicided is removed. In this way, a gate electrode 13 obtained by siliciding the whole gate electrode 4a of polysilicon is formed on the element formation region 50. Silicidation of polysilicon causes the volume thereof to increase. This allows the top surface of the gate electrode 13 to become substantially equal in level to the top end of each sidewall 8a.

In the above-mentioned manner, a MIS transistor including a fully silicided gate electrode 13 can be formed on the element formation region 50, and dummy transistors including non-silicided dummy gate electrodes 4b and 4c, respectively, can be formed on the dummy element formation region 51.

According to the fabrication method for a semiconductor device of this embodiment, only a desired gate electrode can be selectively silicided without siliciding dummy gate electrodes. Therefore, even when a fully silicided gate electrode and a dummy gate electrode are adjacent to each other on the semiconductor substrate 1, a short circuit can be prevented from being caused between the gate electrode and the dummy gate electrode. In view of the above, according to the method of this embodiment, semiconductor devices having a miniaturized circuit can be fabricated with high yield.

As illustrated in FIG. 2E, a semiconductor device of this embodiment fabricated by the above-mentioned method includes a semiconductor substrate 1 in which active regions and an isolation region 2 surrounding each active region are formed, a MIS transistor and a first dummy transistor both formed on one of the active regions of the semiconductor substrate 1, and a second dummy transistor formed on the isolation region 2 of the semiconductor substrate 1.

The MIS transistor includes a gate insulating film 3a, a fully silicided gate electrode 13 formed on the gate insulating film 3a, sidewalls 8a formed on both sides of the gate electrode 13, impurity diffusion layers 7a formed in regions of the semiconductor substrate 1 located to both sides of the sidewalls 8a, and silicide films 10 formed on the impurity diffusion layers 7a.

The first dummy transistor includes a dummy gate insulating film 3b, a dummy gate electrode 4b of polysilicon formed on the dummy gate insulating film 3b, a dummy on-gate insulating film 5b formed on the dummy gate electrode 4b, sidewalls 8b formed on both sides of the dummy gate electrode 4b, impurity diffusion layers 7b formed in regions of the semiconductor substrate 1 located to both sides of the sidewalls 8b, and silicide films 10 formed on the impurity diffusion layers 7b. Unlike the first dummy transistor, the second dummy transistor is formed on the isolation region 2. On the other hand, like the first dummy transistor, instead of a silicide film, a dummy on-gate insulating film 5c is formed on the top surface of the dummy gate electrode 4c.

Since the semiconductor device of this embodiment is formed with a MOS transistor having a fully silicided gate electrode, this prevents the gate electrode from being depleted, resulting in enhanced performance and increased reliability.

Although in this embodiment the gate length of each of dummy gate electrodes 4b and 4c is less than 10 μm, it may be 10 μm or more.

Embodiment 3

Another method for selectively siliciding only a gate electrode formed on an element formation region will be described in a third embodiment of the present invention.

FIGS. 3A through 3E are cross-sectional views illustrating a fabrication method for a semiconductor device according to the third embodiment of the present invention. In these figures, the same components as those of the semiconductor device of each of the first and second embodiments are denoted by the same reference numerals, and thus a description of the same components will be simplified.

Figure 3A:
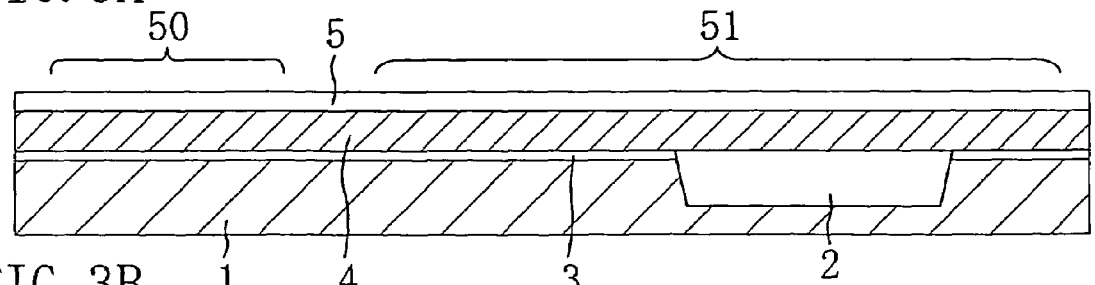
FIGS. 3A through 3E are cross-sectional views illustrating a fabrication method for a semiconductor device according to a third embodiment of the present invention.

First, in the process step illustrated in FIG. 3A, like the process step illustrated in FIG. 1A of the first embodiment, an isolation region 2 is selectively formed in a semiconductor substrate 1. As a result, active regions are formed in the semiconductor substrate 1 so as to be surrounded by the isolation region 2. Subsequently, for example, a 2-nm-thick first insulating film 3 and a 100-nm-thick polysilicon film 4 are deposited on the semiconductor substrate 1. Thereafter, a 20-nm-thick second insulating film 5 is deposited on the top surface of the polysilicon film 4.

Figure 3B:
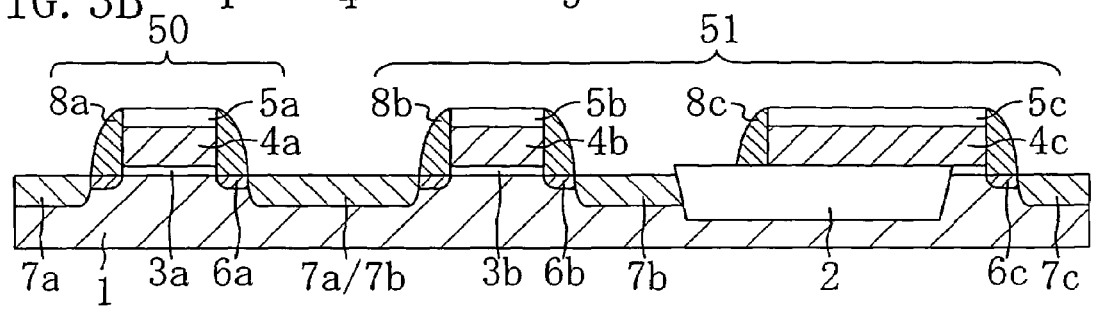

Next, in the process step illustrated in FIG. 3B, like the process step illustrated in FIG. 1B, a pair of a gate insulating film 3a and a gate electrode 4a and a pair of a dummy gate insulating film 3b and a dummy gate electrode 4b are formed on one of the active regions of the semiconductor substrate 1. Simultaneously, a dummy gate electrode 4c is formed on the isolation region 2. The gate electrode 4a, the dummy gate electrode 4b and the dummy gate electrode 4c have gate lengths of approximately 60 nm, 60 nm and 5 µm, respectively. In this process step, the second insulating film 5 is also partially removed. In this way, an on-gate insulating film 5a is formed on the gate electrode 4a, and dummy on-gate insulating films 5b and 5c are formed on the dummy gate electrode 4b and 4c, respectively.

Subsequently, arsenic ions are implanted into the semiconductor substrate 1 by ion implantation, thereby forming extension regions 6a, 6b and 6c. Next, an approximately-13-nm-thick silicon oxide film is formed by CVD using TEOS to entirely cover the semiconductor substrate 1, and then a 50-nm-thick silicon nitride film is formed on the silicon oxide film by CVD. Thereafter, the silicon oxide film and the silicon nitride film are subjected to an etch back process. In this way, approximately-45-nm-wide sidewalls 8a are formed on both sides of the gate electrode 4a, approximately-45-nm-wide sidewalls 8b are formed on both sides of the dummy gate electrode 4b, and approximately-45-nm-wide sidewalls 8c are formed on both sides of the dummy gate electrode 4c. Subsequently, arsenic ions are implanted into the active region of the semiconductor substrate 1 using a combination of the gate electrode 4a and the sidewalls 8a, a combination of the dummy gate electrode 4b and the sidewalls 8b and a combination of the dummy gate electrode 4c and the dummy gate electrode 8c as masks, thereby forming impurity diffusion layers 7a, 7b and 7c.

Figure 3C:
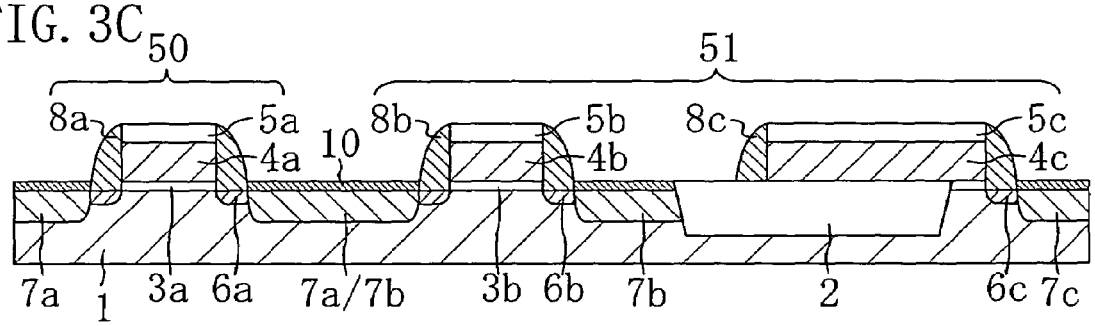

Next, as illustrated in FIG. 3C, an approximately-20- through 40-nm-thick metal film of Co, Ni or any other material is formed by sputtering or any other method to entirely cover the semiconductor substrate 1. Then, the semiconductor substrate 1 is subjected to heat treatment, for example, at a temperature of approximately 320° C. Thereafter, unreacted part of the metal film that is not silicided is removed. In this way, silicide films 10 are formed on the impurity diffusion layers 7a, 7b and 7c formed in the semiconductor substrate 1. The above-mentioned process steps are the same as those illustrated in FIGS. 2A through 2C in the method of the second embodiment.

Figure 3D:
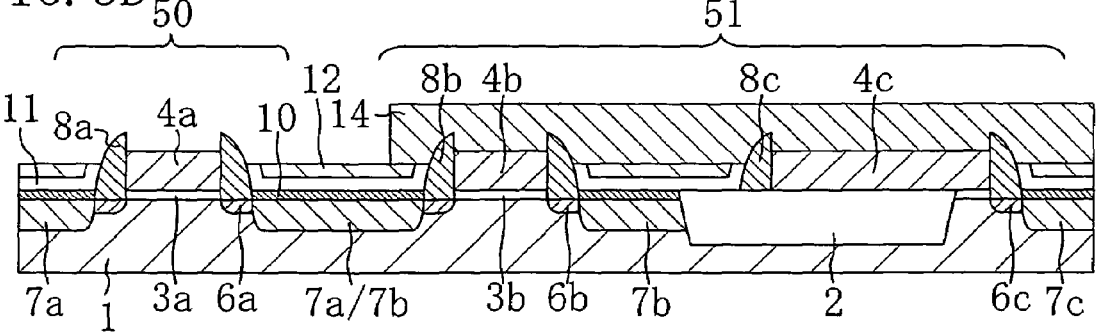

Next, as illustrated in FIG. 3D, an approximately-20-nm-thick silicon nitride film 11 is formed by ALD to entirely cover the semiconductor substrate 1. Subsequently, an approximately-400-nm-thick silicon oxide film 12 is formed on the silicon nitride film 11 by CVD or any other method. Thereafter, the silicon oxide film 12 is polished by CMP to have a thickness of approximately 200 nm. Next, the silicon nitride film 11 and the silicon oxide film 12 are partially removed by RIE. In this case, the silicon oxide film 12 and the silicon nitride film 11 are subjected to etching until the top surfaces of the on-gate insulating film 5a and dummy on-gate insulating films 5b and 5c are exposed. Thereafter, the on-gate insulating film 5a formed on the gate electrode 4a and the dummy on-gate insulating films 5b and 5c formed on the dummy gate electrodes 4b and 4c, respectively, are also removed. Subsequently, an approximately-50-nm-thick silicon oxide film 14 is formed, for example, by CVD to entirely cover the semiconductor substrate 1. A portion of the silicon oxide film 14 formed on the element formation region 50 is removed by lithography and etching until the top surface of the gate electrode 4a is exposed. As a result, a portion of the silicon oxide film 14 covering the dummy element formation region 51 is left.

Figure 3E:
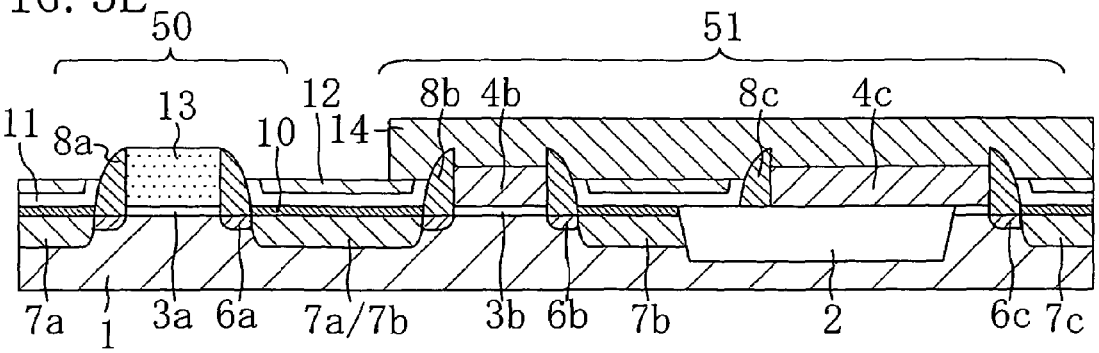

Next, as illustrated in FIG. 3E, an approximately-100-nm-thick metal film of a refractory metal, such as Co or Ni, is formed by sputtering or any other method to entirely cover the semiconductor substrate 1. Next, the semiconductor substrate 1 is subjected to heat treatment, for example, at a temperature of approximately 320° C. In this way, the gate electrode 4a of polysilicon formed on the element formation region 50 is fully silicided, thereby forming a gate electrode 13. Thereafter, unreacted part of the metal film that is not silicided is removed. In the above-mentioned manner, the element formation region 50 can be formed with a MIS transistor having a fully silicided gate electrode 13, and the dummy element formation region 51 can be formed with dummy transistors having dummy gate electrodes 4b and 4c of polysilicon that are not silicided, respectively.

Also according to the fabrication method for a semiconductor device of this embodiment, like the method of the second embodiment, only a desired gate electrode can be selectively silicided without siliciding dummy gate electrodes. Therefore, even when a fully silicided gate electrode and a dummy gate electrode of polysilicon are adjacent to each other on the semiconductor substrate 1, a short circuit can be prevented from being caused between the gate electrode and the dummy gate electrode.

As illustrated in FIG. 3E, the semiconductor device fabricated by the method of this embodiment has substantially the same structure as that of the second embodiment and is different from that of the second embodiment only in that dummy on-gate insulating films 5b and 5c are not formed on dummy gate electrode 4b and 4c, respectively.

Embodiment 4

Figure 4A:
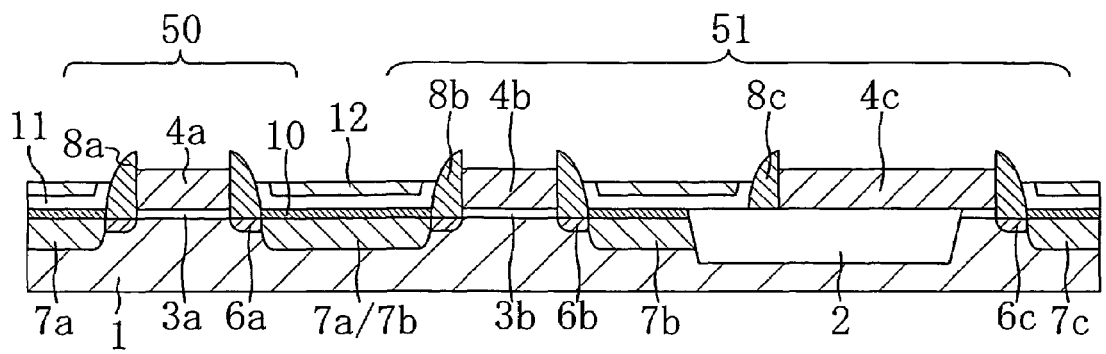
FIGS. 4A through 4C are cross-sectional views illustrating a fabrication method for a semiconductor device according to a fourth embodiment of the present invention.
Figure 4B:
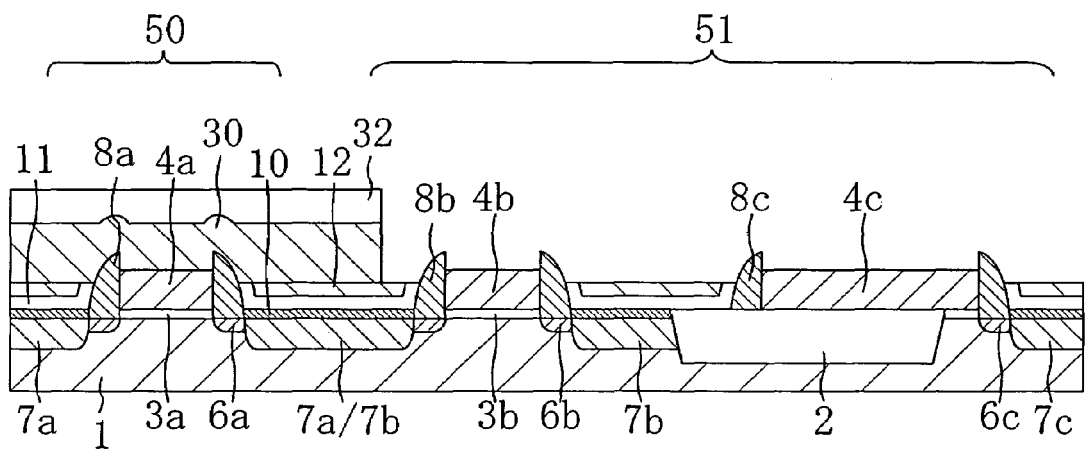
Figure 4C:
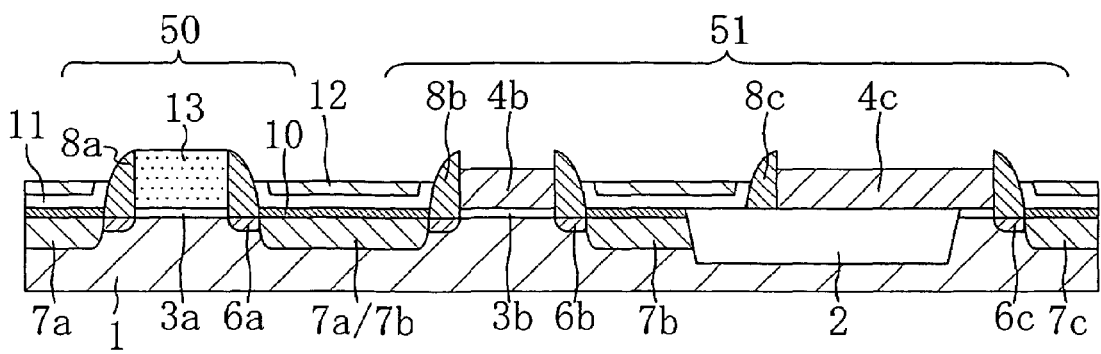

FIGS. 4A through 4C are cross-sectional views illustrating a fabrication method for a semiconductor device according to a fourth embodiment of the present invention. The method of this embodiment is another method for fabricating the same semiconductor device as in the third embodiment.

First, as illustrated in FIG. 4A, in the same process steps as those illustrated in FIGS. 3A through 3C of the third embodiment, a gate insulating film 3a, a gate electrode 4a, an on-gate insulating film 5a, sidewalls 8a are formed on an element formation region 50 of a semiconductor substrate 1, and extension regions 6a and impurity diffusion layers 7a are formed therein. Furthermore, dummy on-gate insulating films 3b and 3c, dummy gate electrodes 4b and 4c, dummy on-gate insulating films 5b and 5c, and sidewalls 8b and 8c are formed on a dummy element formation region 51 of the semiconductor substrate 1, and extension regions 6b and 6c and impurity diffusion layers 7b and 7c are formed therein.

Thereafter, an approximately-20-nm-thick silicon nitride film 11 is formed by ALD to entirely cover the semiconductor substrate 1. Subsequently, an approximately-400-nm-thick silicon oxide film 12 is formed on the silicon nitride film 11 by CVD or any other method. Thereafter, the silicon oxide film 12 is polished by CMP to have a thickness of approximately 200 nm. Next, the silicon nitride film 11 and the silicon oxide film 12 are partially removed by RIE. In this case, the silicon oxide film 12 and the silicon nitride film 11 are subjected to etching until the top surfaces of the on-gate insulating film 5a and dummy on-gate insulating films 5b and 5c are exposed. Thereafter, the on-gate insulating film 5a formed on the top surface of the gate electrode 4a, the dummy on-gate insulating films 5b and 5c formed on the dummy gate electrodes 4b and 4c, respectively, are also removed. Next, as illustrated in FIG. 4B, an approximately-100-nm-thick metal film 30 made of Co, Ni or any other material is formed by sputtering to entirely cover the semiconductor substrate 1. Next, a mask 32 is formed on a portion of the metal film 30 formed on the element formation region 50 by a known method. Subsequently, a portion of the metal film 30 formed on the dummy element formation region 51 is removed by etching using the mask 32.

Next, as illustrated in FIG. 4C, the mask 32 is removed, and then the semiconductor substrate 1 is subjected to heat treatment, for example, at a temperature of approximately 320° C. In this way, only the gate electrode 4a of polysilicon formed on the element formation region 50 is silicided to form a fully silicided gate electrode 13. Thereafter, unreacted part of the metal film that is not silicided is removed. In this process step, no metal film exists on the dummy gate electrodes 4b and 4c. This prevents the dummy gate electrodes 4b and 4c from being silicided.

Also according to the above-mentioned method, only a desired gate electrode can be selectively silicided without siliciding dummy gate electrodes. Therefore, even when a fully silicided gate electrode and a dummy gate electrode of polysilicon are adjacent to each other on the semiconductor substrate 1, a short circuit can be prevented from being caused between the gate electrode and the dummy gate electrode. In view of the above, according to the method of this embodiment, miniaturized semiconductor devices can be fabricated with high yield.

Embodiment 5

Figure 5A:
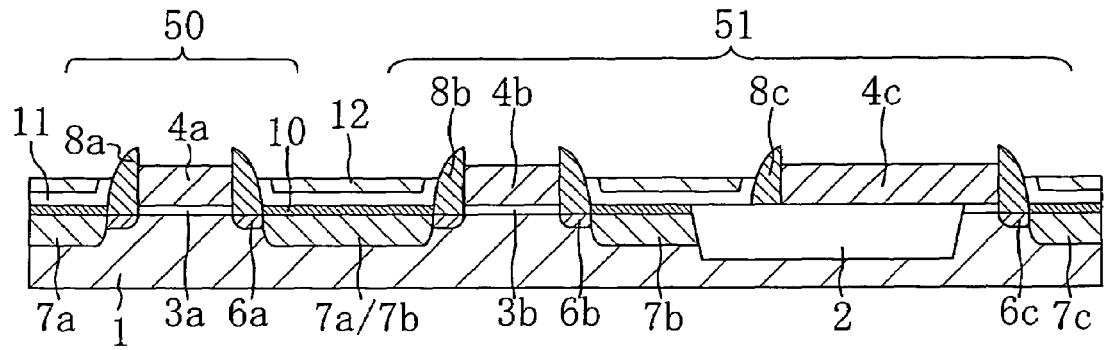
FIGS. 5A through 5C are cross-sectional views illustrating a fabrication method for a semiconductor device according to a fifth embodiment of the present invention.
Figure 5B:
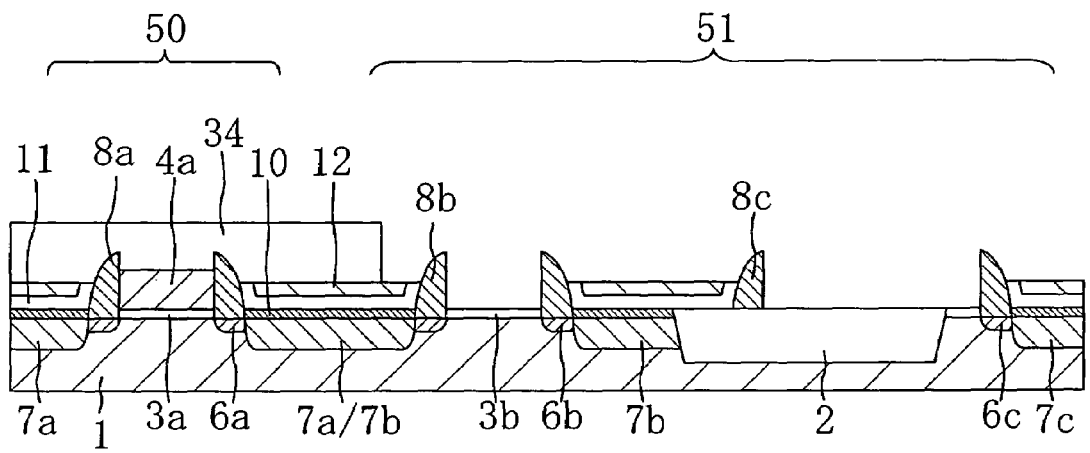
Figure 5C:
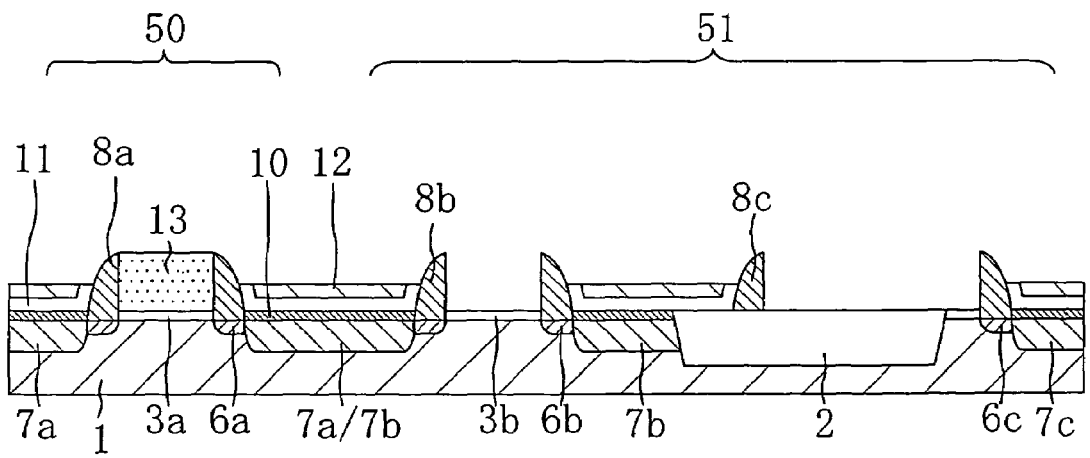
Figure 6A:
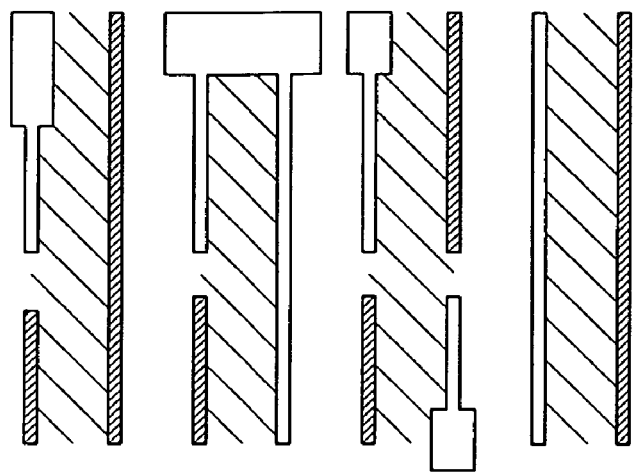
FIGS. 6A and 6B are diagrams illustrating a known formation method for a gate electrode.
Figure 6A:
Figure 6B:
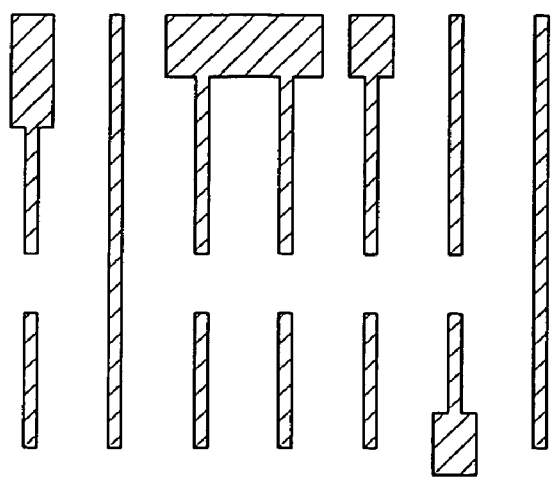

FIGS. 5A through 5C are cross-sectional views illustrating a fabrication method for a semiconductor device according to a fifth embodiment of the present invention. The method of this embodiment is still another method for fabricating the same semiconductor device as in the third embodiment.

First, as illustrated in FIG. 5A, in the same process step as that illustrated in FIG. 4A in the method of the fourth embodiment, respective parts of a silicon nitride film 11 and a silicon oxide film 12, an on-gate insulating film 5a, and dummy on-gate insulating films 5b and 5c (see FIG. 3C) are removed. In this way, the respective top surfaces of a 100-nm-thick gate electrode 4a and 100-nm-thick dummy gate electrode 4b and 4c are exposed.

Next, as illustrated in FIG. 5B, a mask 34 is formed to cover an element formation region 50 of a semiconductor substrate 1. Subsequently, the dummy gate electrodes 4b and 4c are completely removed using the mask 34. Next, the mask 34 is removed, and then a 100-nm-thick metal film of Ni or Co is formed by sputtering to entirely cover the semiconductor substrate 1. Next, the semiconductor substrate 1 is subjected to heat treatment at a temperature of 320° C., and then unreacted part of the metal film that is not silicided is removed. In this way, a fully silicided gate electrode 13 is formed on the element formation region 50. On the other hand, since the dummy gate electrodes 4b and 4c are previously removed from the dummy element formation region 51, no silicide is formed. Thereafter, when an interlayer dielectric is formed to cover the semiconductor substrate 1, the semiconductor device of this embodiment is configured so that its regions occupied by the dummy gate electrodes 4b and 4c are filled with the interlayer dielectric.

Also according to the above-mentioned method, only a desired gate electrode can be selectively silicided. Furthermore, since dummy gate electrodes themselves are removed, this prevents an electrical short circuit from being caused between a gate electrode and a dummy gate electrode even when the gate electrode is silicided.

The method of this embodiment can be applied even when each of dummy gate electrodes of a semiconductor device has any gate length. However, since the method of this embodiment includes the step of removing the dummy gate electrodes, it is not applied to cases where dummy gate electrodes are to be formed to planarize the top surface of an interlayer dielectric. On the other hand, it is preferably applied to fabrication of a semiconductor device including dummy gate electrodes to finish gate electrodes thereof as designed.

Although in the first through fifth embodiments polysilicon is used as a material of a gate electrode 4a and dummy gate electrodes 4b and 4c, silicon, such as amorphous silicon, may be used instead.

As described above, the present invention is useful for formation of a semiconductor device including a gate electrode and a dummy gate electrode formed in the vicinity of the gate electrode.

What is claimed is:

1. A semiconductor device comprising:
   a semiconductor substrate;
   a gate insulating film formed on an active region in the semiconductor substrate;
   a gate electrode formed on the gate insulating film and fully silicided;
   a dummy gate electrode formed above the semiconductor substrate and made of non-silicided silicon; and
   an interlayer dielectric formed on the dummy gate electrode, wherein
   the interlayer dielectric is not formed on the gate electrode, and
   the dummy gate electrode is unnecessary for actual circuit operation.

2. The semiconductor device of claim 1, wherein a dummy gate insulating film is formed on the dummy gate electrode, and the interlayer dielectric is formed on the dummy gate electrode with the dummy gate insulating film interposed therebetween.

3. The semiconductor device of claim 1, wherein the dummy gate electrode is formed on the active region with the dummy gate insulating film interposed therebetween.

4. The semiconductor device of claim 1 further comprising an isolation region formed in the semiconductor substrate, wherein
   the dummy gate electrode is formed on the isolation region.

5. The semiconductor device of claim 1, wherein the interlayer dielectric is made of a silicon oxide film.

6. The semiconductor device of claim 5 further comprising a silicon nitride film formed under the silicon oxide film.

7. The semiconductor device of claim 1 further comprising:
   impurity diffusion layers formed in regions of the active region located to both sides of the gate electrode; and
   silicide films formed on the impurity diffusion layers.

8. The semiconductor device of claim 1 further comprising:
- a first sidewall formed on a side surface of the gate electrode; and
- a second sidewall formed on a side surface of the dummy gate electrode.

9. The semiconductor device of claim 8, wherein the height of an upper surface of the gate electrode is substantially the same as the height of a top portion of the first side wall.

10. The semiconductor device of claim 8, wherein the first sidewall and the second sidewall are respectively made of a silicon oxide film and a silicon nitride film.

11. The semiconductor device of claim 1, wherein the gate electrode is silicided with nickel.

* * * * *